United States Patent [19]

Townsend

[11] 4,089,686
[45] May 16, 1978

[54] METHOD OF DEPOSITING A METAL ON A SURFACE

[75] Inventor: Wesley Peter Townsend, Princeton Township, Mercer County, N.J.

[73] Assignee: Western Electric Company, Inc., New York, N.Y.

[21] Appl. No.: 678,327

[22] Filed: Apr. 19, 1976

[51] Int. Cl.² .............................................. G03C 5/00
[52] U.S. Cl. .................................. 96/35.1; 96/38.4; 204/15; 204/20; 204/30; 427/98; 427/259; 427/305
[58] Field of Search .............. 96/36, 36.2, 35.1, 115 R, 96/115 P, 38.4; 427/98, 259, 305; 428/209; 161/216, 218, 219, 247; 204/14, 15, 20, 30

[56] References Cited

U.S. PATENT DOCUMENTS

| | | | |
|---|---|---|---|
| 3,418,295 | 12/1968 | Schoenthaler | 96/115 X |
| 3,469,982 | 9/1969 | Celeste | 96/35.1 |
| 3,672,925 | 6/1972 | Feldstein | 427/98 |

*Primary Examiner*—Edward C. Kimlin
*Attorney, Agent, or Firm*—J. Rosenstock

[57] ABSTRACT

A method of depositing a metal on a surface of a substrate is disclosed. The method comprises selectively treating the surface with a photopolymerizable composition, comprising an addition polymer containing a plurality of units of the formulae

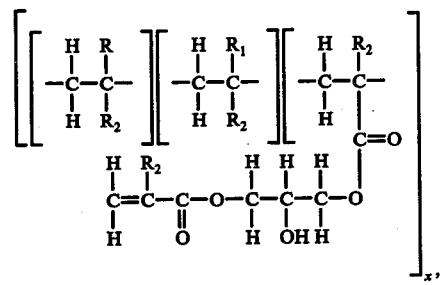

where R and $R_1$ are each a member taken from the group consisting of

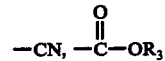

and pyrrolidone, $R_3$ is an alkyl group of 1 to 18 carbons, $R_2$ is a member selected from the group consisting of H and $CH_3$ and $x$ is a positive integer of 10 to 1000, to form a polymerized coating thereof on the surface to delineate an exposed surface pattern conforming to a desired metal pattern. The exposed surface pattern is capable of retaining a noble metal ion thereon. The treated surface is then exposed to a noble metal ion to selectively deposit the metal ion on the exposed pattern.

9 Claims, 4 Drawing Figures

METHOD OF DEPOSITING A METAL ON A SURFACE

BACKGROUND OF THE INVENTION

1. Field of the Invention

This invention relates to a method of depositing a metal on a surface and more particularly, to a method of selectively depositing a metal on a surface of an electrically non-conducting substrate.

2. Discussion of the Prior Art

There is a growing need in various devices and circuit applications for an inexpensive process which will produce adherent conducting circuit patterns on a non-conductor surface. Most of the processes used for metallic pattern generation involve a photographic step. Pattern resolution may be good but most methods are often slow, involving many process steps, and are relatively expensive.

A conventional method for producing macro circuit pattern employs a copper-clad insulator board coated with a photoresist material which is photoexposed and chemically processed to selectively remove copper, leaving a desired circuit pattern. This method is effective but wasteful of copper and chemicals. The high cost of this method has encouraged research and development toward new techniques for metallic pattern generation on a non-conductor surface.

An electroless metal-deposition process is especially attractive for metallic pattern generation since one only needs to produce a pattern of a suitable catalyst on a substrate and metal deposition will occur only on that pattern. However, conventional electroless metal techniques usually involve separate sensitizing and activating steps which are followed by a photoresist masking step prior to immersion in an electroless deposition solution. This plurality of step and the sequency required thereof is time consuming and expensive. Also, where a substrate has a through-hole, additional electroless deposition conditioning steps are often required and add to the expense of manufacture.

A method for selective metal deposition which eliminates one or more conventional steps is therefore desired and needed.

SUMMARY OF THE INVENTION

This invention relates to a method of depositing a metal on a surface and more particularly, to a method of selectively depositing a metal on a surface of an electrically non-conductive substrate.

The method comprises selectively treating the surface with a photopolymerizable composition, comprising an addition polymer containing a plurality of units of the formulae

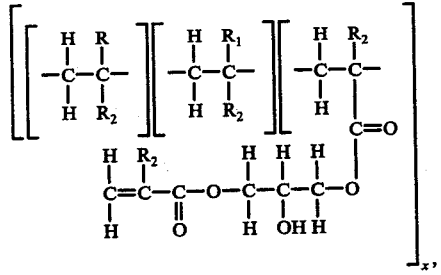

where R and $R_1$ are each a member taken from the group consisting of

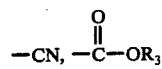

and pyrrolidone, $R_3$ is an alkyl group of 1 to 18 carbons, $R_2$ is a member selected from the group consisting of H and $CH_3$ and $x$ is a positive integer of 10 to 1000, to form a polymerized coating thereof on the surface to delineate an exposed surface pattern, conforming to a desired metal pattern, capable of retaining a noble metal species thereon. The treated surface is exposed to a noble metal species to selectively deposit the species on the exposed pattern.

DESCRIPTION OF THE DRAWINGS

The present invention will be more readily understood by reference to the following drawing taken in conjunction with the detailed description, wherein.

DETAILED DESCRIPTION

The present invention will be discussed primarily in terms of selectively depositing Pd and Cu on a surface of an electrically insulative substrate utilizing conventional lithographic techniques. It will be readily appreciated that the inventive concept is equally applicable to depositing other suitable metals, which are catalytically reduced from their respective ions by catalytic activating metals (Pt, Pd, Ag, Au, etc.). It will also be appreciated that the selective deposition may be carried out utilizing any conventional printing technique as well as brushing and stenciling techniques.

Figure 1:
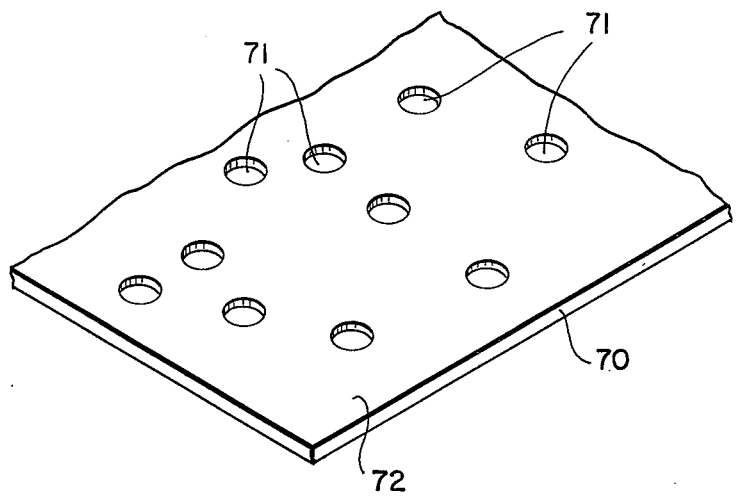
FIG. 1 is an isometric view of a portion of a typical substrate.

Referring to FIG. 1, a suitable substrate 70 is selected. For the production of electrical circuit patterns, suitable substrates are those which are generally electrically non-conductive. In general, all dielectric materials are suitable substrates. Dielectric materials commonly employed comprise a resinous material. If desired, the resinous material may incorporate fibrous reinforcement. For instance, paper or cardboard, glass fiber or other fibrous material may be impregnated with a phenolic, epoxy or fluorohydrocarbon (e.g., polytetrafluoroethylene) resinous material and pressed or rolled to a uniform thickness. Ceramic substrates may likewise be selected. Illustratively, substrate 70 is provided with a plurality of through-holes 71 which are drilled or punched in substrate 70 using any conventional technique known in the art.

Figure 2:
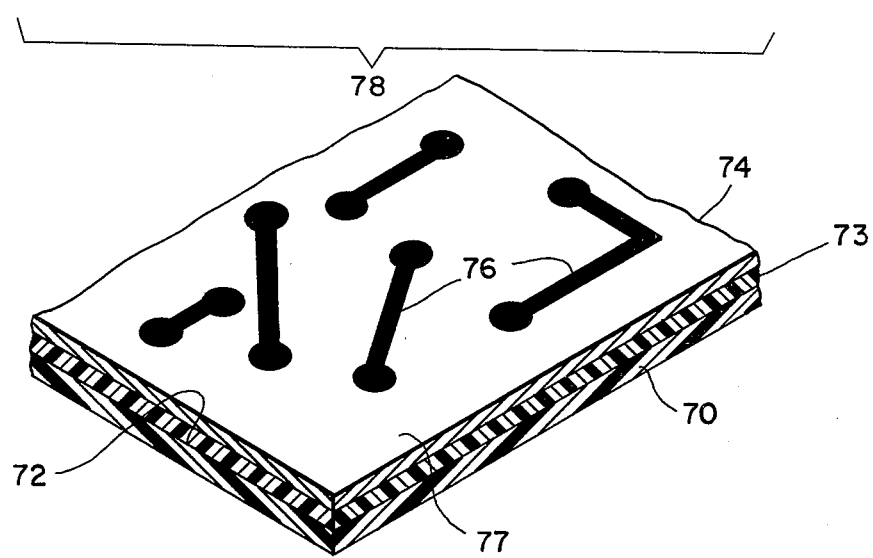
FIG. 2 is an isometric view of the portion of FIG. 1 which has been coated with a polymerizable compound and selectively exposed to a source of radiation.

Substrate 70 may then be cleaned or degreased employing techniques well known in the art. Referring to FIGS. 1 and 2, surface 72 of substrate 70 is treated with a suitable photopolymerizable composition to form a coat or layer 73. Suitable photopolymerizable compositions include the polymerizable polymeric esters disclosed in U.S. Pat. No. 3,418,295 and in U.S. Pat. No. 3,469,982 both incorporated hereinto by reference.

Such polyesters contain a plurality of units of the formulae

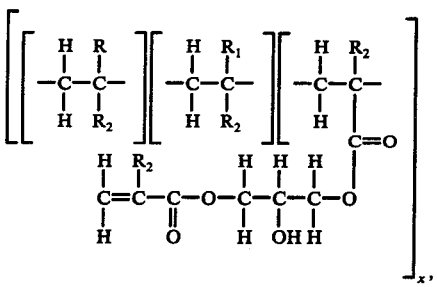

where R and $R_1$ are each a member taken from the group consisting of

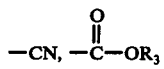

and pyrrolidone, $R_3$ is an alkyl group of 1 to 18 carbons, $R_2$ is a member selected from the group consisting of H and $CH_3$ and x is a positive integer of 10 to 1000. These polyesters are made by reacting in an inert organic solvent solution:

(1) a vinyl addition polymer having a wholly carbon chain or atoms and extralinear glycidyl ester groups in recurring intralinear units of the formula

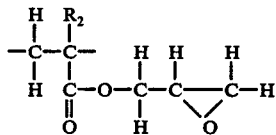

of said chain of atoms, where $R_2$ is a member selected from the group consisting of H and $CH_3$, with (2) acrylic or methacrylic acid in an amount sufficient to react with all the said glycidyl groups present from 10% to 100%, in the polymer to form an acrylic or methacrylic acid ester therewith, in the presence of (3) an organic tertiary amine esterification catalyst, and (4) an addition polymerization inhibitor; and recovering the polymeric ester containing extralinear acrylic ester groups from the solution.

The preferred addition polymers of (1) above are copolymers of unsaturated glycidyl esters with polymerizable vinyl compounds, namely compounds having a terminal methylene group attached through a double bond to the adjacent carbon atom. These materials include the copolymers of unsaturated glycidyl compounds formed with acrylic and methacrylic acid esters and nitriles, e.g., methyl acrylate, methyl methacrylate, ethyl acrylate, ethyl methacrylate, 2-hydroxyethyl methacrylate, n-butyl methacrylate, isobutyl methacrylate and propyl, isopropyl, sec-butyl, tert.-butyl, amyl, hexyl, heptyl, etc., acrylate and methacrylate, acrylonitrile, and vinyl esters, e.g., vinyl acetate, vinyl propionate, vinyl butyrate, vinyl isobutyrate, and vinyl valerate. The preferred glycidyl monomers are glycidyl acrylate and glycidyl methacrylate.

Some suitable polymerization inhibitors include copper metal, cuprous salts, cupric salts, phenyl-α-naphthylamine, 2,2 methylene-bis (4-ethyl-6-tertiary butyl phenol) and N,N'-di-2-napthyl-p-phenylenediamine.

Typically, the photopolymerizable composition is dissolved in a suitable solvent, e.g., a chlorinated hydrocarbon such as methylene chloride, carbon tetrachloride, etc., in a concentration of 10 to 50% solids, and is then applied to surface 72 using any conventional means. The applied solution is then dried to form layer 73. A suitable mask 74 is placed contiguous to polymerizable composition layer 73. Mask 74 is a positive mask, i.e., has areas 76 which are opaque to a desired radiation to which positive mask 74, and, ultimately, layer 73, is destined to be exposed, which areas correspond to a desired electroless metal-deposited pattern. Positive mask 74 has areas 77 which are capable of transmitting therethrough the desired radiation to which positive mask 74 and layer 73 is destined to be exposed. It should be noted that in the alternative, separate masking areas may be applied to layer 73 utilizing standard material and techniques known in the art.

A radiation source 78, e.g., an actinic radiation source, is placed above mask 74 and directed thereat. Radiation is transmitted through areas 77 of mask 74 to expose areas of polymerizable composition layer 73 thereto. The thus exposed areas of layer 73 underlying and corresponding to areas 77 of mask 74 are polymerized. Generally, about a 30 second exposure to a carbon arc source is sufficient.

Figure 3:
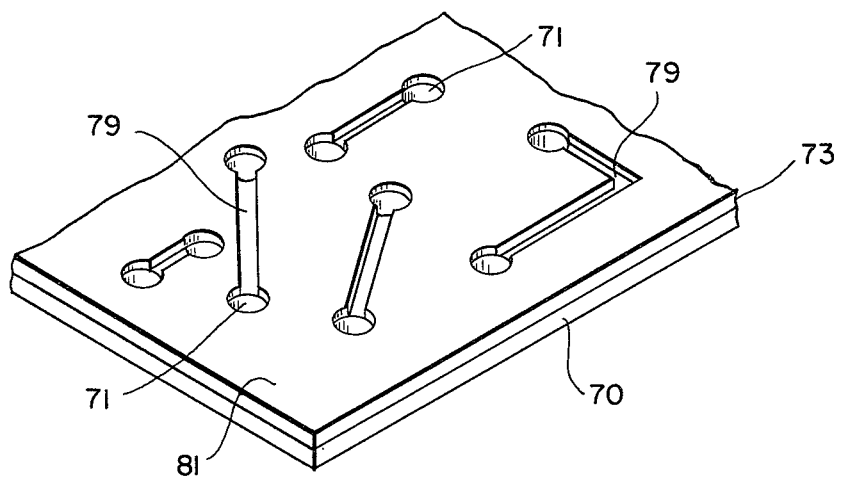
FIG. 3 is an isometric view of the portion of FIG. 2 which has been solvent treated.

After exposure, layer 73 is developed by treating, e.g., by immersion, spraying, etc. substrate 70 with a liquid which is a solvent for the unexposed polymerizable composition, comprising areas underlying and corresponding to areas 76 of mask 74. The solvent is one in which the exposed polymerized composition of layer 73, underlying and corresponding to areas 77 of mask 74, is essentially insoluble. Chlorinated hydrocarbon solvents, e.g., methylene chloride, carbon tetrachloride, 1,1-dichloroethane and 1,1,2-trichloroethylene are quite suitable solvents. Referring to FIGS. 2 and 3, upon development, the areas of layer 73 underlying and corresponding to areas 76 of mask 74 are removed to delineate both an exposed substrate surface pattern 79, including the walls of the through-holes 71, and a polymerized surface pattern 81. Exposed surface pattern 79 has the ability to initially retain a noble metal ion thereon to some degree, even upon rinsing of its surface with an inert agent, e.g., water. On the other hand, polymerized surface pattern 81 has the ability, relative to pattern 79, to initially repel a noble metal ion or conversely has the inability, relative to pattern 79, to intially retain a noble metal ion thereon.

Figure 4:
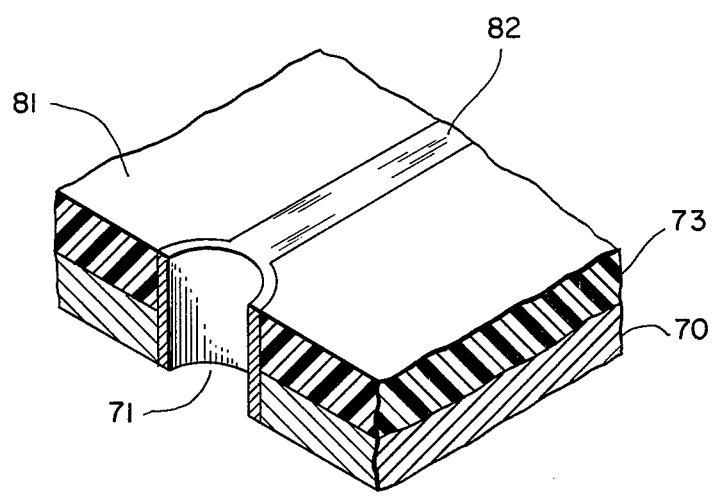
FIG. 4 is a partial isometric view of a portion of the substrate of FIG. 3 having a deposited metal pattern thereon.

Substrate 70 is then treated, e.g., by immersion or spraying, with a solution containing a dissolved salt of a noble metal, e.g., a salt of Pd, Pt, Ag, Au, etc., and is then rinsed with water. Surprisingly, activating metal ions are retained only on pattern 79 and not on pattern 81. The noble metal ion deposited substrate 70 may then be treated with a suitable reducing agent, e.g., a solution containing $Sn^{+2}$ ions, formaldehyde, etc. A suitable reducing agent is one which will reduce a noble metal ion to a catalytic noble metal, i.e., a metal capable of functioning as a reduction catalyst in an autocatalytic process. Such suitable reducing agents are well known in the art or can be easily ascertained experimentally. The noble metal ions, e.g., $Pd^{+2}$, contained on pattern 79 are reduced by the reducing agent to a catalytic metal, e.g., Pd°, to form a catalytic metal-deposited pattern. The catalytic metal-deposited pattern may then be water rinsed and is then subjected to a conventional electroless metal deposition solution, e.g., by immersion therein, wherein an electroless metal ion, e.g., $Cu^{+2}$, $Ni^{+2}$, is reduced to the metal, e.g., Cu, Ni and deposited on surface pattern 79 to form an electroless metal deposit 82 as shown in FIG. 4.

Alternatively, the noble metal ion-deposited substrate 70 may be directly treated with a suitable electroless metal deposition solution wherein sequentially the noble metal ion, e.g., $Pd^{+2}$, is reduced to the metal, e.g., $Pd°$, by the reducing agent contained therein, e.g.,

$H_2N-NH_2$, etc., and the electroless metal ion, e.g., $Cu^{+2}$, is catalytically reduced to the metal, e.g., Cu, to form electroless metal deposit 82.

The electroless metal deposit 82 may be built up to a desired thickness by prolonged exposure to the electroless metal deposition solution or alternatively may be further built up by being electroplated in a standard electroplating bath.

The fact that polymerized pattern 81 does not initially retain a noble metal species without some preliminary treatment thereof is surprising. This is especially surprising and unexpected since if the developed substrate 70 is treated initially with a sensitizing species, e.g., $Sn^{+2}$, followed by treatment with an activating metal species or a noble metal ion, e.g., $Pd^{30\ 2}$, metallization will occur over the entire surface of substrate 70, including patterns 79 and 81, upon subsequent exposure to an electroless metal deposition solution. The same is true if the so-called "one-step activators" are employed which contain a tin species therein. One such typical colloidal one-step activator, revealed in U.S. Pat. No. 3,001,920, contains stannous chloride, palladium chloride and aqueous hydrochloric acid. Another typical one-step activator is revealed in U.S. Pat. No. 3,532,578 which comprises acid-palladium metal-stannous chloride sols.

It is to be noted that the various typical electroless and electroplating solutions and plating conditions and procedures are well known in the art and will not be elaborated herein. Reference in this regard is made to *Metallic Coating of Plastics*, William Goldie, Electrochemical Publications, 1968.

After the electroless metal deposition or the electrodeposition is carried out, the polymerized pattern 81 may be removed, if desired, by treatment with a suitable solvent such as methylene chloride followed by mechanical scrubbing thereof, if needed.

In another manner, the photopolymerizable composition can be selectively applied to surface 72 of substrate 70 (FIG. 1), e.g., as by printing, and then exposed to a source of suitable radiation to form polymerized pattern 81 and exposed surface pattern 79 (FIG. 3). The process of treating the resultant patterned substrate 70 for electroless metal deposition thereon is then carried out as described above.

EXAMPLE I

A copper-clad epoxy-polyester substrate having a through-hole therein was etched with ammonium persulfate (1.5 lbs./gal.) to remove the copper therefrom. An exposed epoxy-polyester surface of the etched substrate was coated with a photopolymerizable composition, commercially obtained, comprising poly (methyl methacrylate/acrylonitrile/ acrylated glycidyl acrylate, 65/10/25) [made according to Example XIV of U.S. Pat. No. 3,418,295]. The coated substrate surface was then selectively exposed to a source of actinic radiation for 50 seconds to polymerize the coating composition so exposed thereto. The selectively exposed substrate surface was then developed by immersion in a bath comprising 1,1,1-trichloroethane whereby unexposed portions of the coating composition (unpolymerized portions) were removed to delineate an exposed substrate surface pattern (including the walls of the through-hole) and a polymerized composition coating pattern. The patterned surface was then immersed in an aqueous solution comprising 0.05 weight percent $PdCl_2$ for 2 minutes at 23° C. and then sprayed with a conventional electroless metal deposition solution, commercially obtained, comprising cupric sulfate and formaldehyde. An electroless copper deposit of approximately 5µ inches was obtained only on the exposed substrate surface (including the walls of the through-hole) and not on the surface of the polymerized composition coating.

EXAMPLE II

For comparison purposes, the procedure of Example I was repeated except that the pattern delineated surface (developed surface) was first sensitized with an aqueous solution comprising 3.5 weight percent $SnCl_2$ and 1.0 weight percent $SnCl_4$. The sensitized surface was then immersed in the $PdCl_2$ solution. A blanket electroless copper deposition was obtained on the entire patterned surface. A spotty, poorly adherent electroless deposit was obtained on the surface of the polymerized composition coating.

EXAMPLE III

For comparison purposes, the procedure of Example I was repeated except that the pattern-delineated surface (developed surface) was treated with a one-step activator, commercially obtained, comprising colloidal palladium metal and a protective colloid comprising a stannic oxide colloid. Again a blanket metallization of the entire substrate surface was obtained. A spotty, poorly adherent electroless-copper deposit was obtained on the surface of the polymerized composition coating.

It is to be understood that the abovedescribed embodiments are simply illustrative of the principles of the invention. Various other modifications and changes may be made by those skilled in the art which will embody the principles of the invention and fall within the spirit and scope thereof.

What is claimed is:

1. A method of depositing a metal on a dielectric surface of a substrate, which comprises:
    (a) selectively polymerizing on the surface a photopolymerizable composition, comprising an addition polymer containing a plurality of units of the formulae

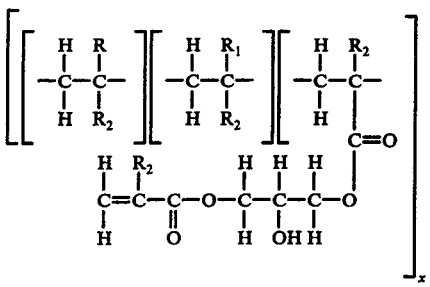

where R and $R_1$ are each a member taken from the group consisting of

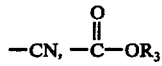

and pyrrolidone, $R_3$ is an alkyl group of 1 to 18 carbons, $R_2$ is a member selected from the group consisting of H and $CH_2$, and $x$ is a positive integer of 10 to 1000, to form a polymerized coating thereof on the surface to delineate an uncoated portion of the surface, conforming to a desired metallic pattern, capable of retaining a noble metal species thereon;
   (b) treating said polymerized coating containing surface with an essentially tin species free solution comprising a noble metal ion to selectively deposit said noble metal ion on said uncoated portion of said surface, wherein said noble metal ion is not retained on or deposited on said polymerized coating; and
   (c) exposing said treated surface to an electroless metal deposition solution to selectively deposit a metal on said deposited uncoated portion of the surface.

2. The method as defined in claim 1 wherein said polymerizing step (a) comprises:
   ($a^1$) coating the surface with said composition; and
   ($b^1$) treating said coated surface to at least polymerize said composition, wherein at least one of said coating and treating steps in ($a^1$) and ($b^1$) is restricted to a selected pattern on said surface to form said delineating polymerized coating.

3. The method as defined in claim 2 wherein in step (b′) said coated surface is selectively exposed to a source of light to polymerize said composition, and said selectively exposed surface is treated with a suitable solvent to remove unpolymerized portions of said composition to delineate said uncoated portion of the surface.

4. The method as defined in claim 1 wherein in step (b) said noble metal ion comprises $Pd^{+2}$.

5. The method as defined in claim 1 which further comprises, prior to step (c), treating said noble metal ion-deposited uncoated portion to reduce said deposited noble metal ion to a catalytic noble metal to form a catalytic noble metal deposit on said uncoated portion of the surface.

6. A method of selectively depositing a metal on a dielectric surface, which comprises:
   (a) coating the surface with a photopolymerizable composition comprising an addition polymer containing a plurality of units of the formulae

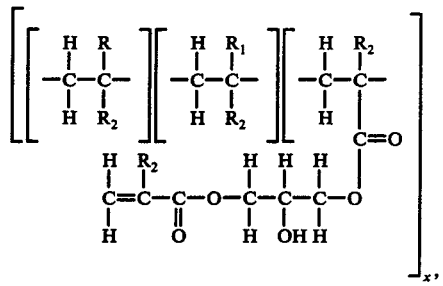

where R and $R_1$ are each a member taken from the group consisting of

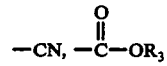

and pyrrolidone, $R_3$ is an alkyl group of 1 to 18 carbons, $R_2$ is a member selected from the group consisting of H and $CH_3$ and $x$ is a positive integer of 10 to 1000;
   (b) selectively exposing said coating surface to a source of light to polymerize said composition exposed thereto;
   (c) developing said light-exposed surface to delineate a polymerized surface coating pattern incapable of retaining a noble metal ion thereon and an uncoated portion of the surface capable of retaining a noble metal ion thereon;
   (d) treating said developed surface with an essentially tin species free solution comprising a noble metal ion capable of participating in an electroless metal deposition catalysis to deposit said noble metal ion on said uncoated portion of the surface, wherein said noble metal ion is not retained on or deposited on said polymerized coating; and
   (e) exposing said treated surface to an electroless metal deposition solution to selectively deposit a metal on said noble metal ion deposited portion.

7. The method as defined in claim 6 wherein said noble metal ion comprises a palladium ion.

8. The method as defined in claim 6 which further comprises electroplating said metal-deposited portion to electrodeposit a metal thereon.

9. The method as defined in claim 6 which further comprises, prior to step (e), treating said treated surface to reduce said deposited noble metal ion to a catalytic noble metal to form a catalytic noble metal deposit on said uncoated portion of the surface.

* * * * *

UNITED STATES PATENT OFFICE
CERTIFICATE OF CORRECTION

Patent No. 4,089,686　　　　　　　Dated May 16, 1978

Inventor(s) Wesley P. Townsend

It is certified that error appears in the above-identified patent and that said Letters Patent are hereby corrected as shown below:

In the specification, Column 1, line 21, "pattern" should read --patterns--; line 37, "step" should read --steps--. Column 4, line 19, "material" should read --materials--. Column 5, line 30, "$Pd^{30}$ 2" should read --$Pd^{+2}$--; lines 36-37, "U.S. Pat. No. 3,001,920" should read --U.S. Pat. No. 3,011,920--. Column 6, line 54, "abovedescribed" should read --above-described--.

In the claims, claim 6, column 8, line 31, "said coating" should read --said coated--.

Signed and Sealed this

*Tenth* Day of *October 1978*

[SEAL]

Attest:

RUTH C. MASON
*Attesting Officer*

DONALD W. BANNER
*Commissioner of Patents and Trademarks*